United States Patent
Sakai et al.

(10) Patent No.: US 7,171,066 B1
(45) Date of Patent: Jan. 30, 2007

(54) OPTICAL MODULE AND OPTICAL TRANSMISSION DEVICE

(75) Inventors: Kazuhiro Sakai, Kanagawa (JP); Osamu Ueno, Kanagawa (JP); Osamu Ohtani, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 11/356,348

(22) Filed: Feb. 17, 2006

(30) Foreign Application Priority Data

Sep. 7, 2005 (JP) ............................. 2005-259586
Sep. 16, 2005 (JP) ............................. 2005-269526

(51) Int. Cl.
*G02B 6/12* (2006.01)
*G02B 6/26* (2006.01)
*G02B 6/36* (2006.01)

(52) U.S. Cl. ............................. 385/14; 385/52; 385/92
(58) Field of Classification Search ................ 385/14, 385/52, 92
See application file for complete search history.

(56) References Cited

U.S. PATENT DOCUMENTS

| 4,737,019 | A | * | 4/1988 | Baker | 349/196 |
| 5,229,879 | A | * | 7/1993 | Gen-ei | 359/344 |
| 6,043,550 | A | * | 3/2000 | Kuhara et al. | 257/461 |
| 6,748,143 | B2 | * | 6/2004 | Kuhara et al. | 385/49 |
| 2002/0057876 | A1 | * | 5/2002 | Yamabayashi et al. | 385/88 |
| 2002/0067751 | A1 | * | 6/2002 | Ohbuchi | 372/45 |
| 2003/0123819 | A1 | * | 7/2003 | Nakanishi et al. | 385/92 |
| 2003/0210866 | A1 | * | 11/2003 | Kuhara et al. | 385/49 |
| 2003/0231829 | A1 | * | 12/2003 | Meyers et al. | 385/33 |
| 2003/0231841 | A1 | * | 12/2003 | Nakanishi et al. | 385/92 |
| 2004/0042071 | A1 | * | 3/2004 | Sato | 359/355 |
| 2005/0008285 | A1 | * | 1/2005 | Kim et al. | 385/18 |

FOREIGN PATENT DOCUMENTS

| JP | 2003-329892 | 11/2003 |
| JP | 2004-212774 | 7/2004 |
| JP | 2004-226941 | 8/2004 |

* cited by examiner

*Primary Examiner*—Kaveh Kianni
(74) *Attorney, Agent, or Firm*—Oliff & Berridge, PLC

(57) ABSTRACT

An optical module includes a base portion; a surface type optical element receiving or emitting light; an optical waveguide being mounted on the base portion; a holding member being mounted on the base portion; a cap being mounted on the base portion; and a fixing member. The optical waveguide includes on an end portion of the optical waveguide light input/output end face that transmits light therebetween. The holding member positions and holds the surface type optical element and one end portion of the optical waveguide. The cap includes a light transmitting window provided in a position opposing to the other end portion of the optical waveguide. The cap at least partially covers the optical element and the optical waveguide. The fixing member fixes the other end portion of the optical waveguide and the cap.

13 Claims, 15 Drawing Sheets

OPTICAL MODULE AND OPTICAL TRANSMISSION DEVICE

CROSS-REFERENCE TO RELATED APPLICATIONS

This application is based on and claims the benefit of priority from the prior Japanese Patent Applications No. 2005-259586, filed on Sep. 7, 2005, and No. 2005-269526, filed on Sep. 16, 2005; the entire contents of which are incorporated-herein by reference.

BACKGROUND OF THE INVENTION

1. Field of the Invention

The present invention relates to an optical module and an optical transmission device for performing an optical communication by using an optical element portion, which includes a light emitting element and a light receiving element, and an optical waveguide.

2. Description of the Related Art

In first related art, a low cost optical transmission device using surface type optical elements such as a surface emitting laser (VCSEL) and a photodiode (PD), which have a light receiving/emitting portion on a side opposite to a mounting surface thereof, is known and, in order to realize downsizing, cost reduction and high performance, the use of an optical waveguide for optically coupling an optical transmission medium such as optical fiber to the surface type optical element is under consideration.

The optical module includes a surface emitting or surface receiving type optical element and an optical waveguide. A recessed portion is formed in the optical waveguide and the optical waveguide is positioned with respect to the optical element by optically positioning the optical element by a CCD camera with using the recessed portion as a mark and connected to the optical element by an adhesive.

In second related art, an optical transmission module has been used in an optical communication. The optical transmission module is configured by optical elements such as a light emitting element, which may be a surface emitting laser (VCSEL), and a light receiving element, which may be a photodiode (PD), and an optical waveguide for optically coupling the optical elements and the optical fiber such that an interactive communication can be performed through the optical fiber.

The optical waveguide mounted such that it stands in an optical axis of the optical element and the optical transmission module mounted such that it lays in a direction orthogonal to an optical axis direction of the optical element have been proposed.

SUMMARY OF INVENTION

However, since, in the first related art, an optical module, the other end of the optical waveguide is not fixed, there is a problem that an optical axis is deviated by a change with the passage of time, resulting in degradation of coupling efficiency. In addition thereto, there is a problem that the optical axis alignment is difficult.

In the second related art, the optical transmission module, there is a problem that a space between mounting parts is narrowed due to miniaturization of the module and bonding wires for connecting the optical element to electrode pins for external connection obstruct a front area of the light emitting element. In particular, since the optical waveguide is three dimensional and the size thereof is large, arranging routes of the bonding wires are obstructed by the optical waveguide. Therefore, there is a threat that the wiring bonding becomes difficult or impossible. Further, when the arrangement of the bonding wires is preferential, there are problems that the configuration of the optical transmission module is restricted, the design freedom is degraded and the fabrication cost is increased.

The present invention has been made in view of the above circumstances. The present invention provides an optical module and an optical transmission device using the same optical module, in which the optical axis alignment of a surface type light emitting element and an optical waveguide is easy and with which the longtime reliability of coupling efficiency of the optical module with respect to an optical transmission medium is realized. Further, the present invention provides a low cost optical transmission module, which houses mounting parts such as an optical element and an optical waveguide and with which electrical connections within the module can be performed easily, the design freedom is high and the cost reduction of the optical transmission module is possible.

Further more, the present invention provides an optical transmission module, which houses mounting parts such as an optical element and an optical waveguide and with which thermal influence of bonding wires is restricted and a high reliability is obtained even at high speed operation.

According to a first aspect of the present invention, the optical module is characterized by comprising a base portion, a surface type optical element for receiving or emitting light, an optical waveguide for transmitting light between light receiving or emitting end faces provided in opposite end portions thereof, a holding member mounted on the base portion, for positioning and holding the surface type optical element and one of the end portions of the optical waveguide, a cap mounted on the base portion and having a light transmitting window provided in a position opposing to the other of the end portions of the optical waveguide, for covering the optical element and the optical waveguide and a fixing member for fixing the other end portion of the optical waveguide and the cap.

According to a second aspect of the present invention, an optical transmission device is characterized by comprising an optical module, a coupler member mounted on the optical module and having an optical system connected to an optical transmission medium and a circuit board connected to the optical module.

According to a third aspect of the present invention, an optical transmission module is characterized by comprising a sub mount mounted on a mounting surface on which the sub mount is to be mounted, an optical element mounted on the sub mount, a mounting part mounted on the mounting surface or the sub mount independently from the optical element and a relay electrode formed on the sub mount in a position remote from the mounting part, for assisting a wiring to the optical element.

BRIEF DESCRIPTION OF THE DRAWINGS

These and other objects and advantages of this invention will become more fully apparent from the following detailed description taken with the accompanying drawings in which:

FIGS. 4A, 4B show another example of the construction of the sub mount, in which FIG. 4A is a plan view and FIG. 4B is a side view thereof;

FIGS. 7A, 7B show an arrangement and shape of a fixing member in the optical module shown in FIG. 6, in which FIG. 7A is a plan view when the fixing member is circular and FIG. 7B is a plan view when the fixing member is ellipsoidal;

FIGS. 9A, 9B shows a peripheral construction of the fixing member shown in FIG. 8, in which FIG. 9A is a cross sectional front view and FIG. 9B is a cross sectional side view thereof;

DESCRIPTION OF THE EMBODIMENTS

First Embodiment

Figure 1:
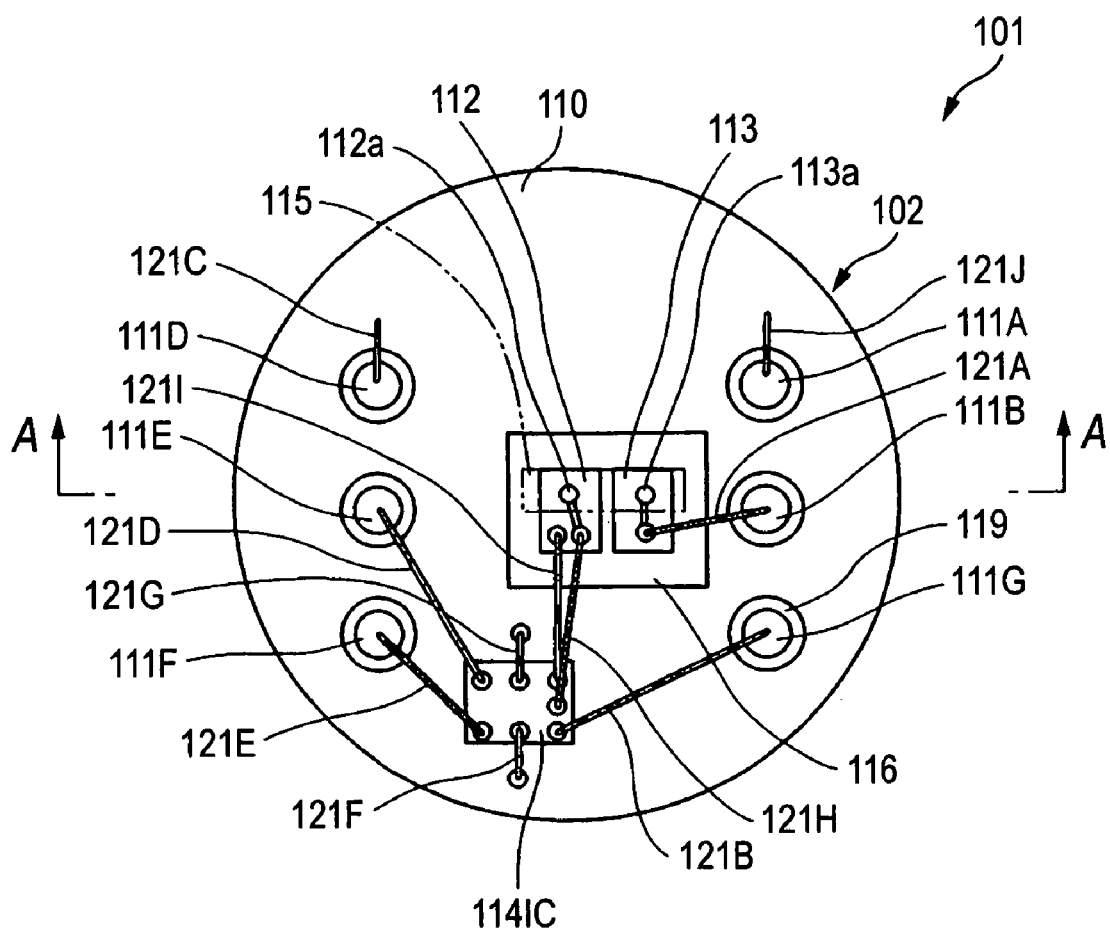
FIG. 1 is a plan view showing a construction of a main portion of an optical transmission device according to a first embodiment.
Figure 2:
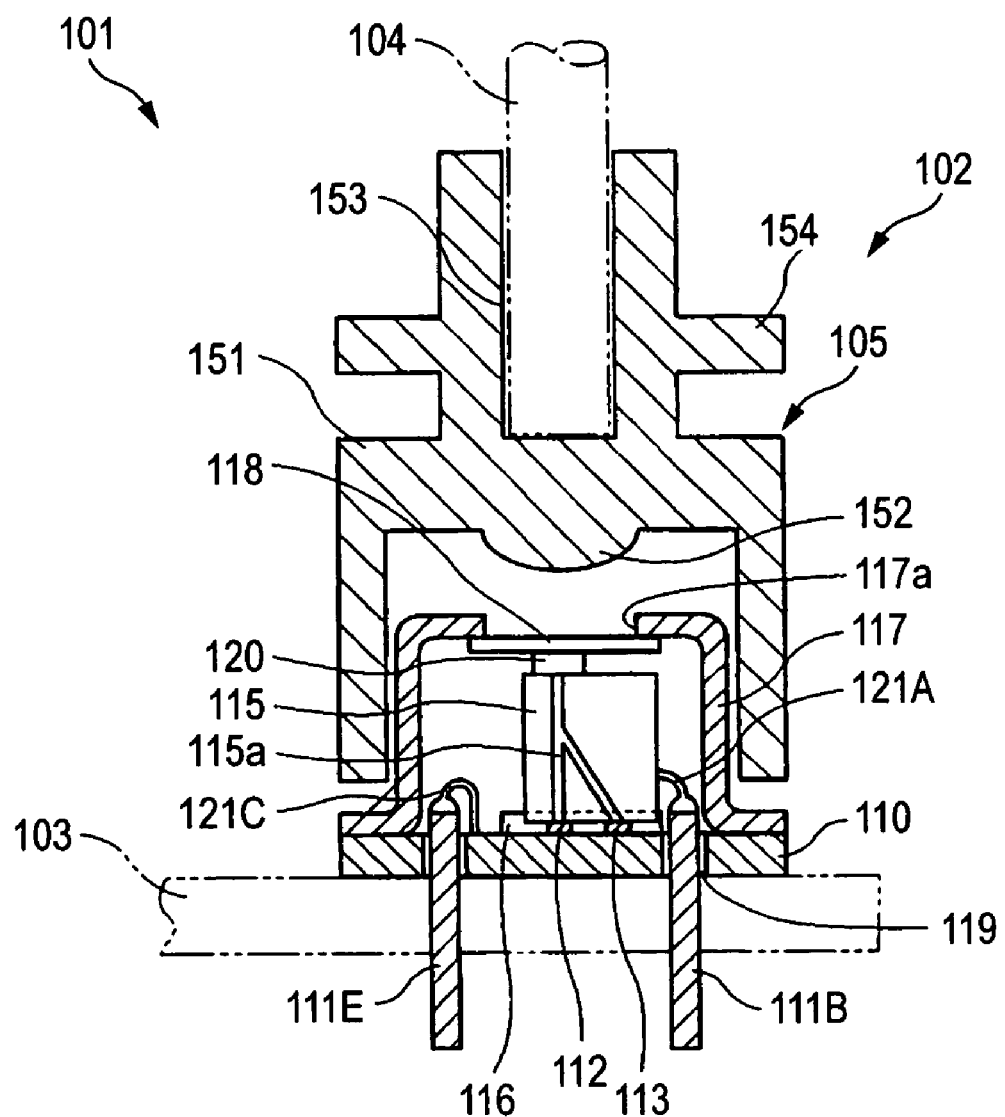
FIG. 2 is a cross sectional view of the optical transmission device, taken along a line A—A in FIG. 1.

FIG. 1 is a plan view of an optical transmission device according to a first embodiment of the present invention and FIG. 2 is a cross sectional view taken along a line A—A in FIG. 1.

The optical transmission device 101 is configured by an optical module 102, to which an optical fiber 104 is connected as an optical transmission medium, and a circuit board 103, on which the optical module 102 is mounted.

The optical module 102 includes a metal stem 110 as a base portion, a light receiving element 112 and a light emitting element 113 provided on the metal stem 110 as a surface type optical element, an IC 114 for amplifying an output signal of the light receiving element 112, an optical waveguide 115 optically coupled with the light receiving element 112 and the light emitting element 113, a sub mount 116 as a fixing member for positioning and holding the light receiving element 112, the light emitting element 113 and the optical waveguide 115, a metal cap 117 having an opening 117a in a ceiling surface thereof, for sealing respective members on the metal stem 110, a transparent window 118 for sealing the opening 117a from an inside of the cap and a fixing member 120 for fixing the transparent window 118 and the optical waveguide 115.

The optical module 102 includes a plurality of electrode pins 111 held by insulators 119 provided in the metal stem 110. The electrode pins 111 are connected to the light receiving element 112, the light emitting element 113 and the IC 114 through bonding wires 121A to 121J and a coupler member 105 for connecting the optical fiber 104 is mounted on an outer side of the cap 117.

The coupler member 105 is formed by molding of transparent resin and is detachably mounted on the cap 117. The coupler member 105 includes a housing portion 151 mounted on the cap 117, a lens portion 152 formed in a center portion in the housing portion 151, a cylindrical optical fiber inserting portion 153 formed in an upper portion of the housing portion 151, into which the optical fiber 104 is inserted, and a collar portion 154 provided on an outer periphery of the optical fiber inserting portion 153.

A predetermined gap is provided between a lower end surface of the housing portion 151 and an upper surface of a periphery of the cap 117. With such gap, it is possible to finely regulate the coupler member 105 vertically and horizontally so that a focus regulation of the lens portion 152 can be done.

The metal stem 110 takes in the form of disk formed of a metal such as copper or a copper alloy, to which a grounding bonding wire can be connected.

Electrode pins 111A and 111B are used to transmit signal and electrode pins 111C to 111F are used to receive signal. An electrode pin 111C is used for power supply, an electrode pin 111D is used for grounding (GND) and electrode pins 111E and 111F are used to obtain a differential output.

The light receiving element 112 includes a light receiving portion 112a provided on an upper surface thereof for receiving optical signal. A lower mounting surface of the light receiving element 112 is mounted on the metal stem 110. The light receiving element 112 is a surface type optical element such as a GaAs PIN photo diode having two electrodes on the upper surface.

The light emitting element 113 includes a light emitting portion 113a provided on an upper surface thereof for emitting optical signal. A lower mounting surface thereof is mounted on the metal stem 110. The light emitting element 113 is a surface type optical element having electrodes on the upper and lower surfaces thereof. For example, the light emitting element may be a VCSEL of wavelength 850 nm.

For example, the optical waveguide 115 is a high molecular optical waveguide, which is configured by a core member of such as acrylic resin, epoxy resin or polyimide resin and in which a distribution light transmission portion 115a having an inverted Y shape is formed, and a clad formed of such as fluorocarbon polymer having refractive index smaller than that of the core member and surrounding the light transmission portion 115a. The light transmission portion 115a includes a light input/output portion optically coupled with the optical fiber, a light receiving portion optically coupled with the light emitting portion 113a of the light emitting element 113 and a light emitting portion optically coupled with the light receiving portion 112a of the light receiving element 112. Such optical waveguide 115 may be fabricated as follows. That is, the high molecular optical waveguide is fabricated by filling a recessed portion formed in a surface of a hardened resin mold with a core forming resin such as thermosetting or ultraviolet-ray setting resin, attaching a clad forming film to a surface of the mold, setting the core forming resin, removing the hardened core forming resin from the mold and forming a clad layer on the side of a core forming surface of the clad forming film.

In order to reduce external noise, the cap 117 takes in the form of a metal canister and a lower end portion of the cap 117 is fixed to the metal stem 110 by, for example, electrically conductive adhesive as shown in FIG. 2.

The transparent window 118 having a predetermined configuration is formed from a plastic material such as polymethyl methacrylate, polycarbonate or amorphous polyolefin or inorganic glass. A peripheral portion of the transparent window 118 is fixed to an inside surface of the cap 117 by such as adhesive.

The fixing member 120 has refractive index similar to that of the optical waveguide 115 and the transparent window 118. A difference in refractive index between the fixing member 120 and the optical waveguide 115 and the transparent window 118 is preferably within 0.1 in view of the transmission loss due to Fresnel reflection. It is more preferable that the difference is within 0.05. As the fixing member 120, an adhesive having refractive index matching characteristics and transparency, such as epoxy adhesive, silicon adhesive, acrylic adhesive or ultraviolet-ray setting adhesive may be used.

(Construction of the Circuit Board)

The circuit board 103 includes a base member, lead patterns formed on both surfaces of the base member, pin holes, which are connected to the lead patterns and into which the electrode pins 111A—111F of the optical module 102 are inserted, the IC for driving the optical element 113 and various electronic parts such as capacitors and resistors.

(Construction of the Sub Mount)

Figure 3:
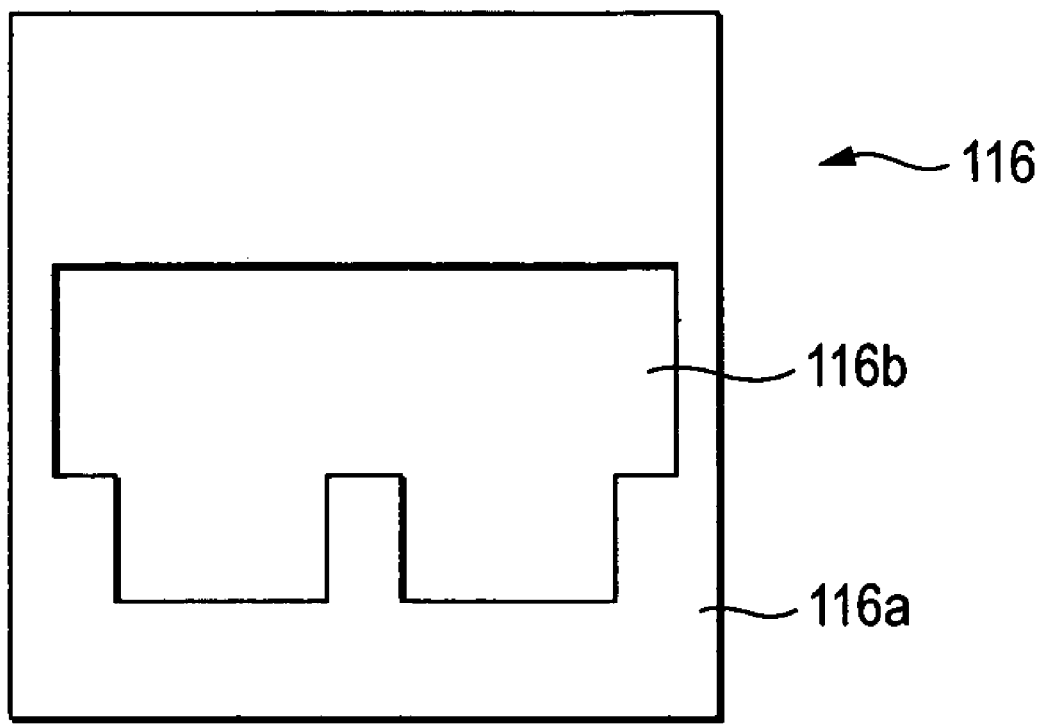
FIG. 3 is a plan view showing a sub mount of an optical module according to the first embodiment.

FIG. 3 shows a construction of the sub mount. The sub mount 116 includes a body 116a molded by resin and a through-hole 116b provided in a center portion of the body 116a, having a shape corresponding to an outer shape of the optical waveguide 115 provided on the light receiving element 112 and the light emitting element 113, and positioned by inserting the light receiving element 112, the light emitting element 113, and the optical waveguide 115 therethrough.

(Assembling of the Optical module)

The sub mount 116 is fixed to a predetermined position of the metal stem 110 having the electrode pins 121 by an adhesive. Then, the light receiving element 112 and the light emitting element 113 are inserted into the through-hole 116b of the sub mount 116 and the mounting surfaces of the light receiving element 112 and the light emitting element 113 are fixed to the metal stem 110 by an adhesive. Incidentally, the light emitting element 113 is fixed by using electrically conductive adhesive. Thereafter, the optical waveguide 115 is inserted into the through-hole 116b of the sub mount 116 such that the lower end surface of the optical waveguide 115 becomes in contact with the light receiving element 112 and the light emitting element 113 and is fixed to the sub mount 116 by an adhesive. The lower end surface of the light guide portion 115a is optically coupled with the light receiving portion 112a of the light receiving element 112 and the light emitting portion 113a of the light emitting element 113. The IC 114 is fixed to a predetermined position on the metal stem 110.

Thereafter, the light emitting element 113 is connected to the electrode pin 111B by a bonding wire 121A. The grounding electrode of the IC 114 and the electrode pins 111A and 111D are connected to the metal stem 110 by bonding wires 121F, 121G, 121J and 121C, respectively. The light receiving element 112 is connected to the IC 114 by bonding wires 121H and 121I, the drive IC 114 is connected to the receiving electrode pins 111E and 111F by bonding wires 121D and 121E, respectively.

The optical module 102 thus fabricated is mounted on the circuit board 103 by inserting the electrode pins 111A to 111F thereof into connecting through-holes formed in the circuit board 103 shown in FIG. 2. Thereafter, the coupler member 105 is fitted on the cap 118 and the optical fiber 104 is held by the optical fiber insertion portion 153. After the positioning of the coupler member 105 is completed, the coupler member 105 is fixed to the cap 118 by epoxy resin. Thus, the optical transmission device 101 is completed.

(Operation of the Optical Transmission Device)

When an optical signal is transmitted to the optical module 102 through the optical fiber 104, the signal is guided to the light guide portion 115a of the optical waveguide 115 through the transparent window 118 and the fixing member 120. The optical signal from the light guide portion 115a is guided to the light receiving portion 112a of the light receiving element 112 and converted into an electric signal by the light receiving element 112. The electric signal is amplified by the IC 114 and differential signals obtained by the IC 114 are outputted to the circuit board 103 through the electrode pins 111E and 111F.

On the other hand, when the light emitting element 113 is driven by a signal externally inputted to the electrode pin 111B, the light emitting portion 113a thereof generates an optical signal. This optical signal is supplied to the optical guide portion 115a of the optical waveguide 115 and then to the optical fiber 104 through the fixing member 120 and the transparent window 118. Thus, the interactive communication is performed through the optical fiber 104, as mentioned previously.

(Advantage of the First Embodiment)

According to the first embodiment, the following advantages can be obtained.

(a) Since one end of the optical waveguide 115 is fixed to the sub mount 116 and the other end of the optical waveguide 115 is fixed to the transparent window 118 by the fixing member 120, the longtime reliability is obtained in the construction in which the optical waveguide 115 is vertically mounted within the CAN package.

(b) Since the fixing of the optical waveguide 115 and the transparent window 118 can be done by only the fixing member 120, cost reduction of the optical module 102 as well as the optical transmission device 101 is possible.

(c) Since the positioning of the light receiving element 112, the light emitting element 113 and the light guide portion 115a of the optical waveguide 115 is performed by merely inserting them into the through-hole 116b of the sub mount 116, the optical axis alignment of the light receiving element 112, the light emitting element 113 and the optical waveguide 115 becomes easy.

(Other Constructions of the Sub Mount)

Figure 4A:
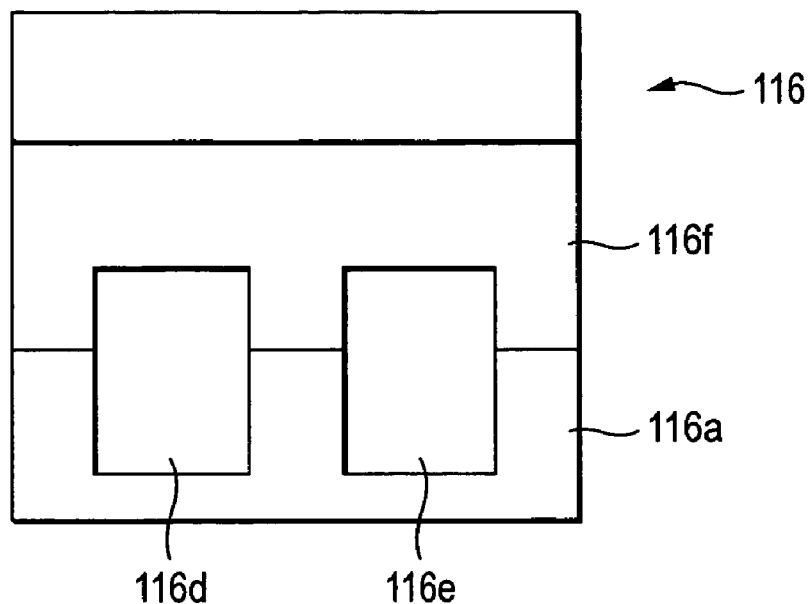
Figure 4B:
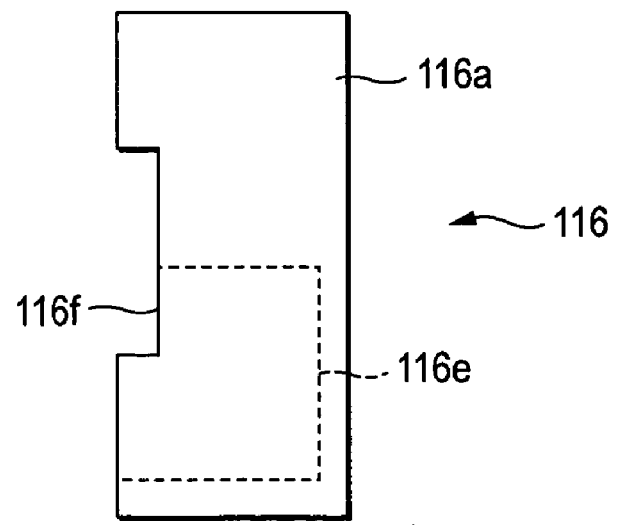

FIGS. 4A and 4B show another construction of the sub mount, in which FIG. 4A is a plan view thereof and FIG. 4B is a side view thereof. This sub mount 116 includes a recessed portion 116d, which has depth equal to or larger than the height of the light receiving element 112 and receives the light receiving element 112 to position the latter, a recessed portion 116e, which is provided adjacent to the recessed portion 116d, has depth equal to or larger than the height of the light emitting element 113 and receives the light emitting element 113 to position the latter, and a recessed portion 116f, which is formed by cutting away portions of the recessed portions 116d and 116e to be positioned by inserting the optical waveguide 115.

When the sub mount 116 shown in FIGS. 4A, 4B is used, a lower surface (mounting surface) of the sub mount 116 does not contact with the metal stem 110. Therefore, the direct grounding connection is impossible. In view of this fact, an optical element having electrodes on an upper surface thereof is used and the grounding connection is realized by using a bonding wire.

Second Embodiment

Figure 5:
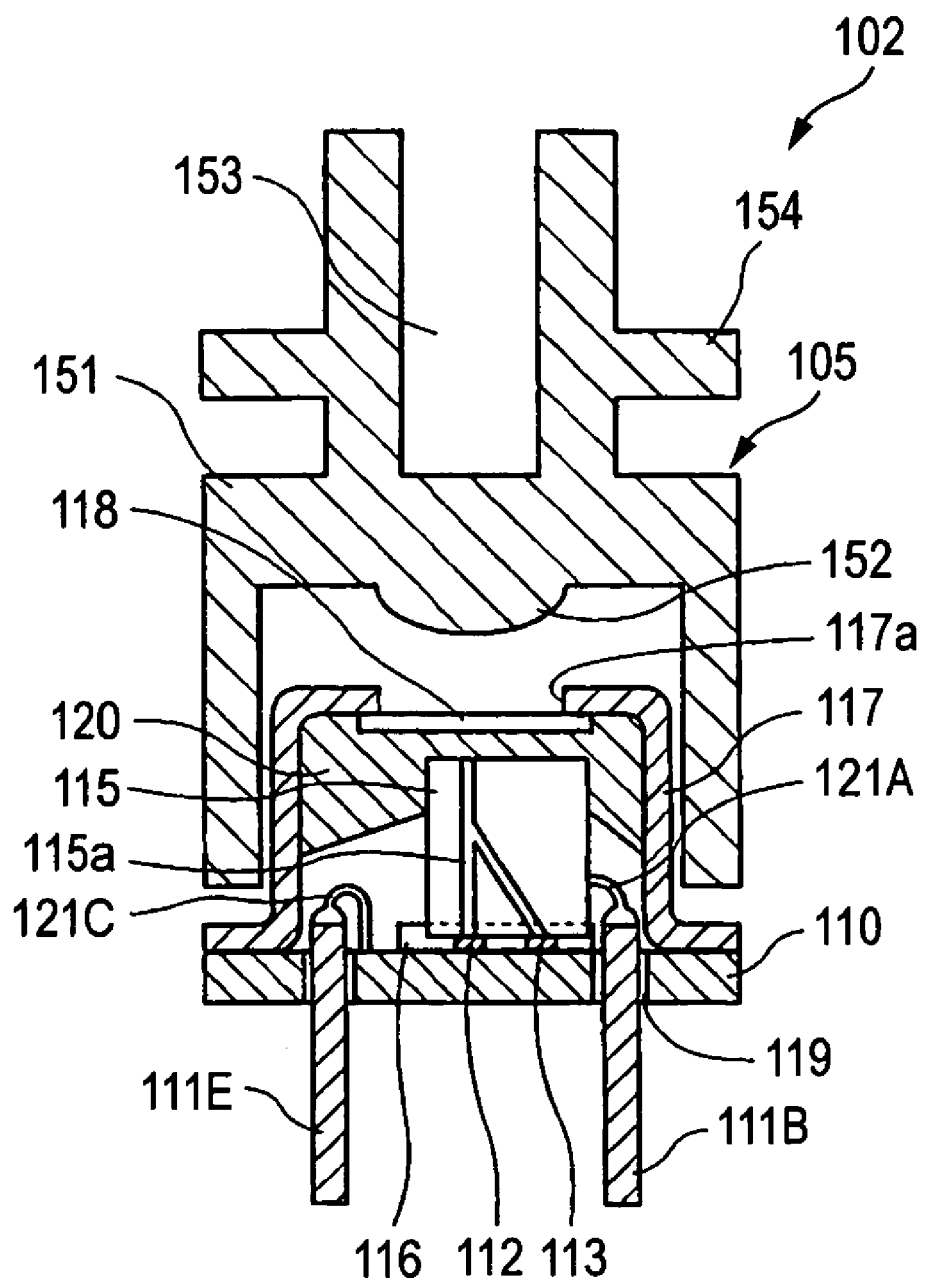
FIG. 5 is a cross sectional view showing an optical module according to a second embodiment.

FIG. 5 shows an optical module according to the second embodiment of the present invention. The second embodiment is similar to the optical module 102 of the first embodiment except that a gel-type refractive index matching agent is used as the fixing member 120 and the fixing member 120 fills a space between the cap 117 and the optical waveguide 115.

The gel-type refractive index matching agent may be, for example, gel-type silicone resin. The gel-type refractive index matching agent has refractive index similar to that of the optical waveguide 115 and the transparent window 118 and a different in refractive index between the fixing member 120 and the optical waveguide 115 and the transparent window 118 is preferably within 0.1 in view of the transmission loss due to Fresnel reflection. It is more preferable that the difference is within 0.05. Since the gel-type refractive index matching agent is a jelly, it is possible to obtain an enough adhering force with respect to the inside surface of the cap 117.

According to the second embodiment, by the use of the gel-type refractive index matching agent as the fixing member 120, it is possible to reliably fix the optical waveguide 115 by pressing a large area of the latter and the longtime reliability can be obtained. Further, cost reduction is also possible.

Third Embodiment

Figure 6:
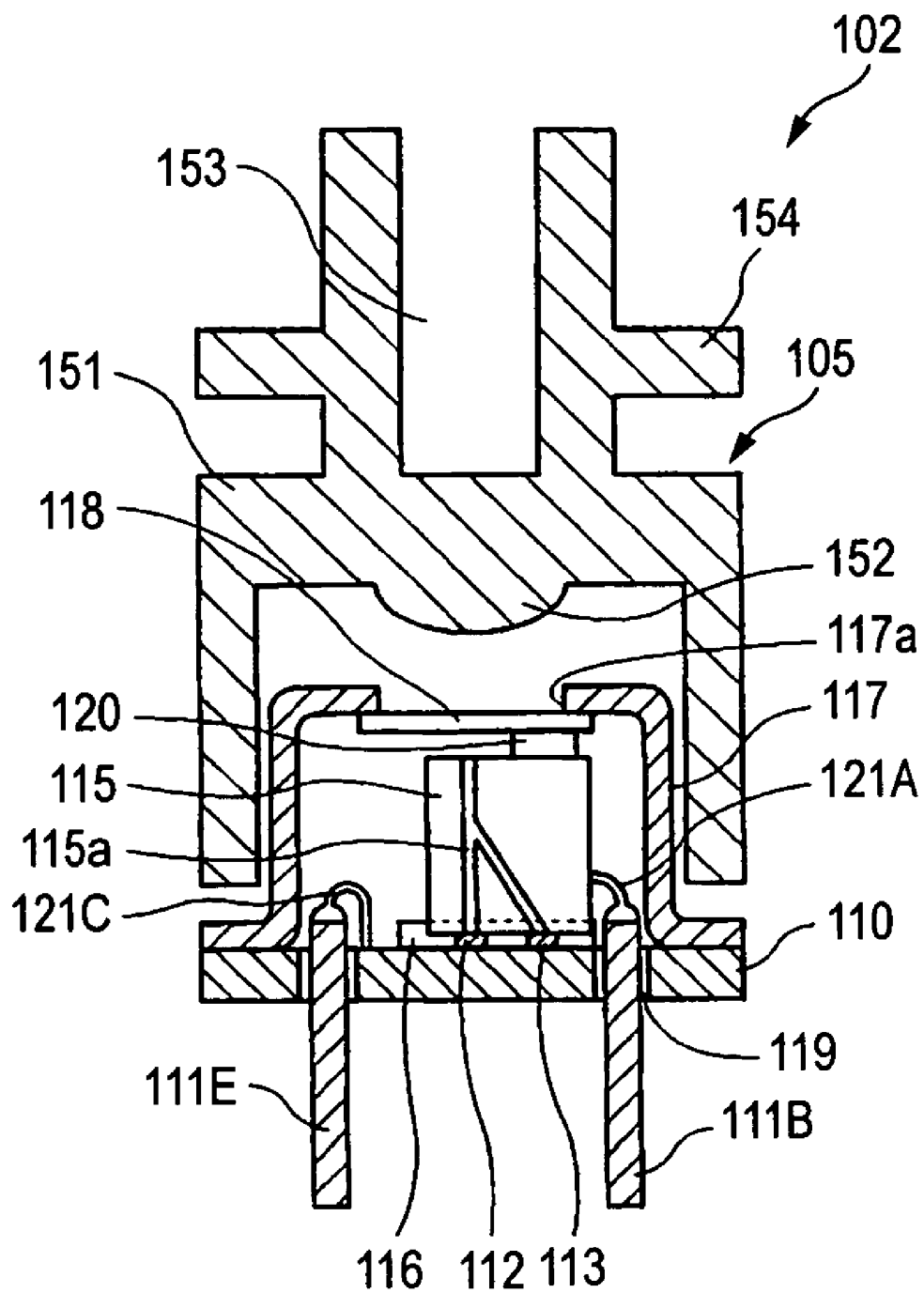
FIG. 6 is a cross sectional view showing an optical module according to a third embodiment.
Figure 7A:
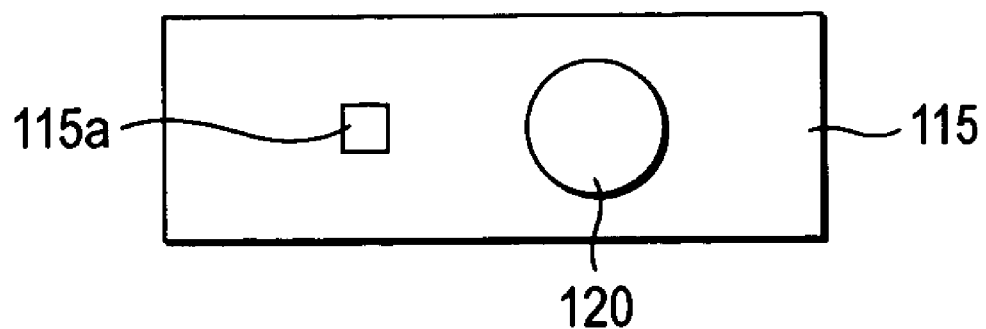
Figure 7B:
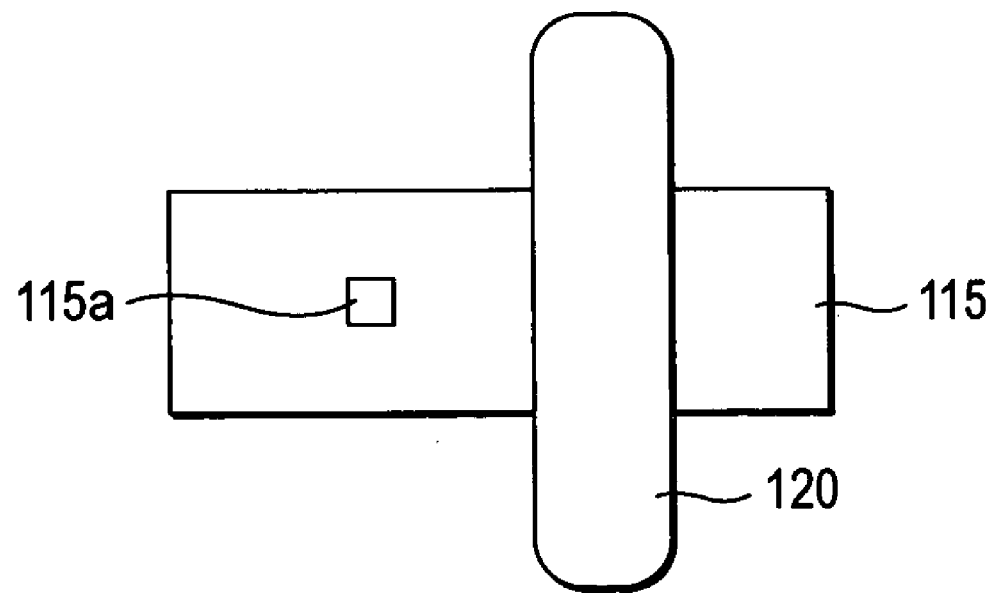

FIG. 6 shows an optical module according to the third embodiment of the present invention and FIGS. 7A, 7B shows the position and configuration of the fixing member shown in FIG. 6. As shown in FIGS. 6, 7A, and 7B, the third embodiment is substantially the same as the optical module 102 of the first embodiment except that the fixing member 120 of the third embodiment is an elastic member and is provided in a position in the vicinity of the center portion of the end face of the optical waveguide 115 and spaced apart from the position of the light guide portion 115a.

As the elastic member, transparent silicon rubber may be used. The elastic member has a circular configuration as shown in FIG. 7A or an ellipsoidal configuration as shown in FIG. 7B. In either case, the fixing member 120 is arranged such that it exerts elastic force (pressing force) on the optical waveguide 115 and the transparent window 118.

The elastic member may be provided on the side of the optical waveguide 115 or on the side of the transparent window 118. When the elastic member is provided on the side of the optical waveguide 115, it is possible to fix the optical waveguide 115 and the transparent window 118 reliably and stably. When the elastic member is provided in the transparent window 118, it becomes possible to fabricate the optical module 102 easily.

According to the third embodiment, in which the elastic member is use as the fixing member 120, deviation of constructive elements due to vibration and difference in thermal expansion coefficient can be absorbed and the longtime reliability can be obtained. Further, cost reduction becomes possible.

Fourth Embodiment

Figure 8:
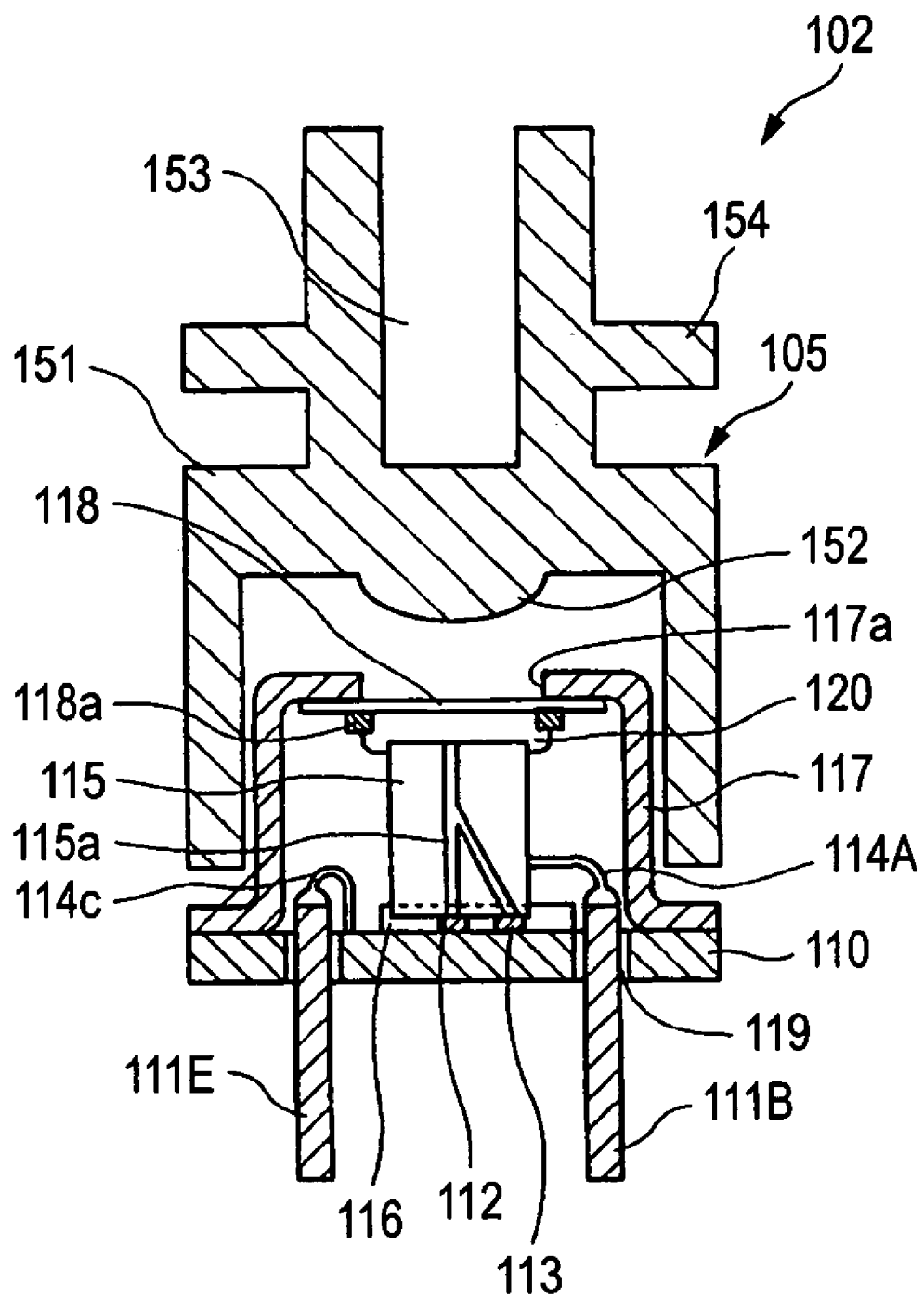
FIG. 8 is a cross sectional view of an optical module according to a fourth embodiment.
Figure 9A:
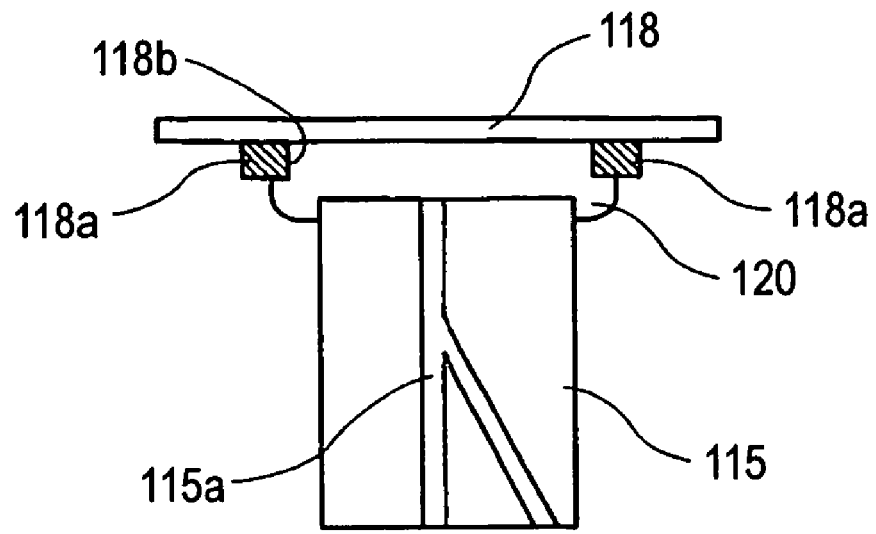
Figure 9B:
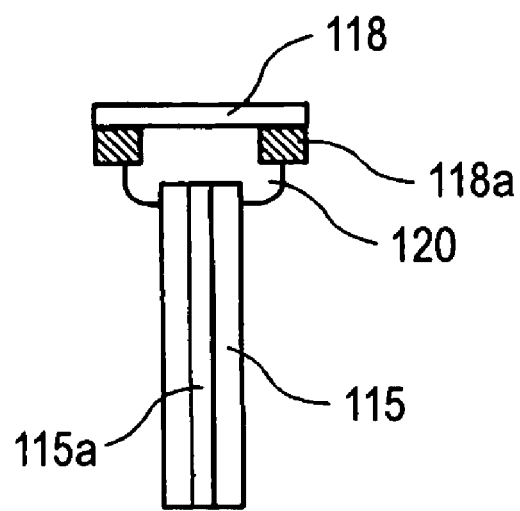

FIG. 8 shows an optical module according to the fourth embodiment of the present invention and FIGS. 9A, 9B show a construction around a fixing member shown in FIG. 8. As shown in FIGS. 9A, 9B, the fourth embodiment is substantially the same as the optical module of the first embodiment except that, in the fourth embodiment, a bank-shaped guide portion 118a in the transparent window 118 is provided and the fixing member 120, which is an adhesive or a gel-type refractive index matching agent, is inserted into a recessed portion 118b formed by the guide portion 118a.

According to the fourth embodiment, in which the fixing member 120 is put in the recessed portion 118b of the transparent window 118, it is possible to fix the optical waveguide 115 and the transparent window 118 more stably and to restrict pressing-out of the fixing member 120 to the utmost. Therefore, it is possible to fix the optical waveguide 115 by a small amount of the fixing member 120.

Incidentally, the guide portion 118a may be provided in not the transparent window 118 but the vicinity of the transparent window 118 inside of the cap 117. Further, the configuration of the guide portion 118a may be circular or square. Alternatively, a pair of guide portions may be provided in opposing two sides of the transparent window.

Other Embodiments

Incidentally, the present invention is not limited to the described embodiments and these may be modified in various manners within the scope of the technical thought of the present invention.

Further, though, in the optical transmission device 101 and the optical module 102, the combination of the light emitting element and the light receiving element is described, a combination of two light emitting elements or a combination of two light receiving elements may be used. Incidentally, in such case, the guide portion 115a of the optical waveguide 115 may have Y-shape.

Further, a drive IC for driving the light emitting element 113 may be mounted in the optical module 102.

According to the embodiments, the optical waveguide may be a plate-like waveguide.

According to the embodiments, the fixing member for fixing the other end portion of the optical waveguide and the light transmitting window of the cap may be an adhesive having matched refractive index matching characteristics, a filler having refractive index matching characteristics, an elastic member having refractive index matching characteristics or a material having adhesion, elasticity and refractive index matching characteristics.

According to the embodiments, by using a material having refractive index matching characteristics as the fixing member, reflection of light at the light input/output end faces of the optical waveguide is reduced, so that return light to a light source and cross-talk to the light receiving element are reduced. When the fixing member is the adhesive, it is possible to firmly fix the optical waveguide to the cap. When the filler is used as the fixing member, it is possible to reliably fix the optical waveguide under pressure. When the fixing member has elasticity, it is possible to absorb deviation of constructive members due to vibration and difference of thermal expansion coefficient thereof.

According to the embodiments, when the portion other than the light input/output portion of the other end portion of the optical waveguide is fixed to the cap, an elastic member for fixing the optical waveguide under pressure or an adhesive may be used as the fixing member.

According to the embodiments, the light transmitting window of the cap may have a recessed portion on the side of the optical waveguide. The fixing member having refractive index matching characteristics may fit into the recessed portion to fix the other end portion of the optical waveguide therein. In such case, it is possible to fix the optical waveguide and the light transmitting-window by a small amount of the fixing material.

According to the embodiments, the base portion and the cap may be formed of metal. In such case, it is possible to reduce external noise and cross-talk.

According to the embodiments, the holding member may have a first through-hole, into which the surface type optical element is inserted, for positioning the surface type optical element, and a second through-hole, into which the optical waveguide is inserted, for positioning the optical waveguide. According to this construction, the positioning of the surface type optical element and the optical waveguide is possible by merely inserting the surface type optical element and the optical waveguide into the respective through-holes of the holding member. Therefore, the optical axis alignment of the surface type optical element and the optical waveguide is facilitated. Further, by the use of the through-holes as positioning means, the formation of the holding member becomes easy.

According to the embodiments, the holding member may have a first recessed portion, in which the surface type optical element is fitted, for positioning the surface type optical element by fitting the surface type optical element and a second recessed portion, in which the optical waveguide is fitted, for positioning the optical waveguide. In such case, since the positioning of the surface type optical element and the optical waveguide can be done by merely fitting the surface type optical element and the optical waveguide in the respective recessed portions, the optical axis alignment of the surface type optical element and the optical waveguide is facilitated. Further, it is possible to provide a gap between a light receiving plane of the surface type optical element and the light input/output end faces of the optical waveguide by regulating the depth of the first recessed portion. It is possible to improve the coupling efficiency of the surface type optical element and the optical waveguide, by forming a refractive index matching layer in the gap. Further, with the provision of the gap, the optical guide portion of the optical waveguide is prevented from being damaged by heat generated in the surface type optical element.

According to the embodiments, the surface type optical element may include a surface type light emitting element and a surface type light receiving element and the optical waveguide may include an optical guide portion for connecting a light input portion and a light output portion of the light input/output end face, which are optically connected to the surface type light emitting element and the surface type light receiving element, respectively, to the light input/output end portions of one of the light input/output end faces of the other end portion, which is optically connected to an external optical transmission medium. In such case, it is possible to perform an interactive communication through one core by a compact optical module.

According to the embodiments, a longtime reliability of coupling efficiency of the optical module with respect to an optical transmission medium such as optical fiber is obtained since both end portions of the optical waveguide are fixed.

According to the embodiments, the longtime reliability thereof is obtained by mounting optical modules, which are fixedly mounted on opposite end portions of the optical waveguide, on the circuit board.

According to the embodiments, the optical axis alignment of the surface type light emitting element and the optical waveguide becomes easy and the reliability can be kept for long time.

Fifth Embodiment

Figure 10:
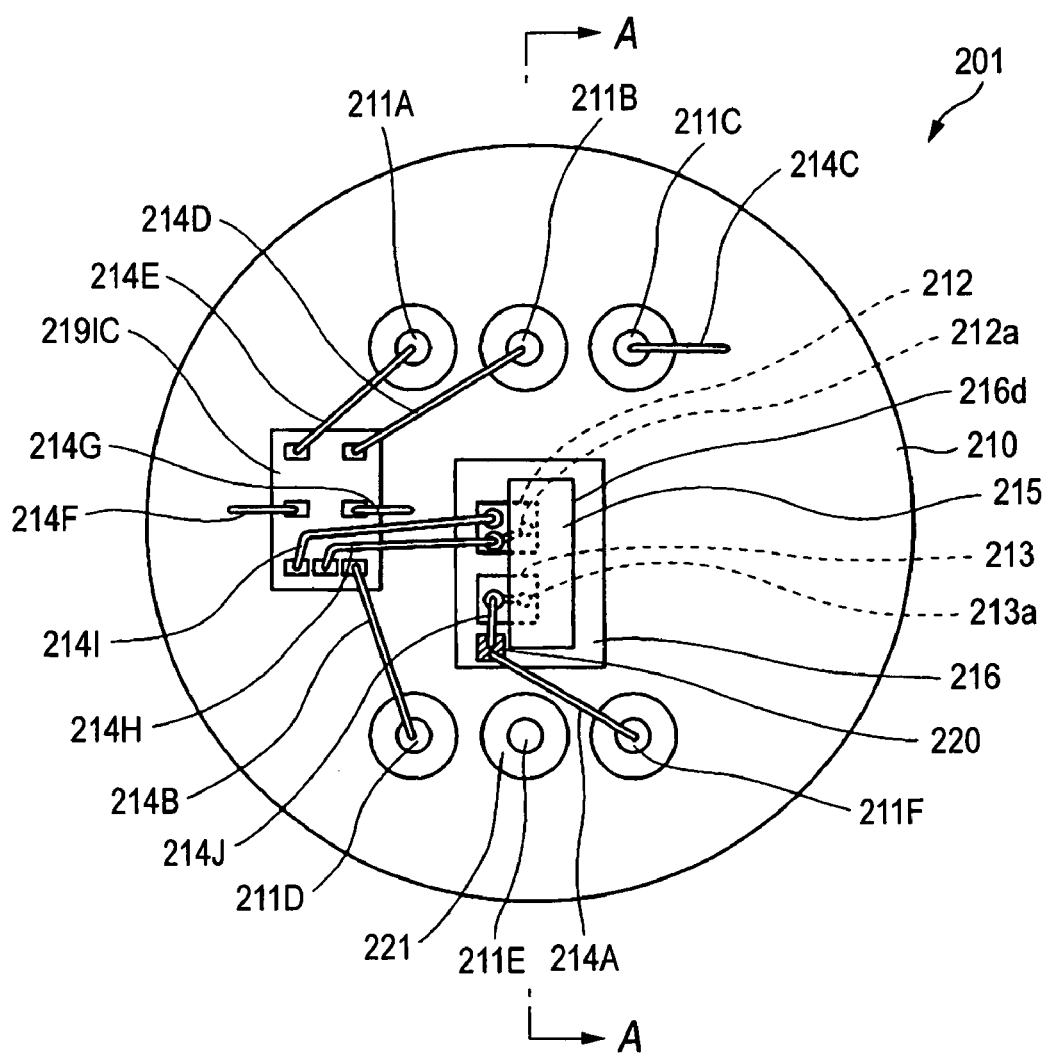
FIG. 10 is a plan view of an optical transmission module according to the fifth embodiment.
Figure 11:
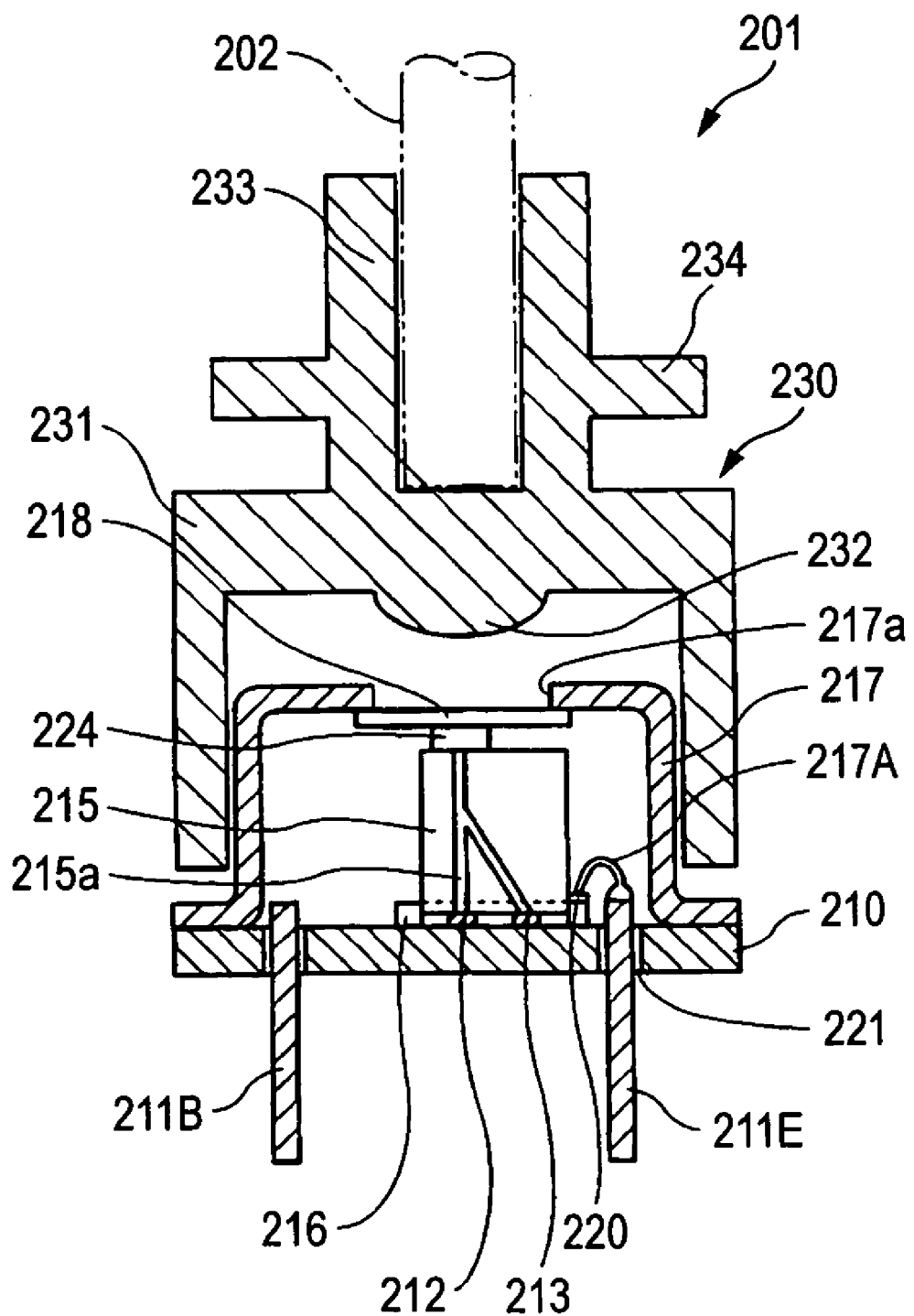
FIG. 11 is a cross sectional view of the optical transmission device, taken along a line A—A in FIG. 1.

FIG. 10 shows an optical transmission device (hereinafter, referred to as "optical transmission module") according to a fifth embodiment of the present invention and FIG. 11 is a cross section taken along a line A—A in FIG. 10. Incidentally, FIG. 10 shows mounting parts on a metal stem.

The optical transmission module 201 includes the metal stem 210, which has an upper surface on which the mounting parts are to be mounted, a light receiving element 212 and a light emitting element 213, which are arranged on the metal stem 210, an optical waveguide 215, which is optically coupled to a light receiving portion 212a of the light receiving element 212 and a light emitting portion 213a of the light emitting element 213, a sub mount 216, which positions the light receiving element 212, the light emitting element 213 and the optical waveguide 215, and an IC 219 provided on the metal stem 210 for amplifying an output signal of the light receiving element 212.

The optical transmission module 201 has a plurality of electrode pins 211 (211A to 211F) supported on the metal stem 210 by an insulator 221. The electrode pins 211 connect between the light receiving element 212, the light emitting element 213 and the IC 219 by bonding wires 214 (214A to 214J). A relay electrode portion 220 for assisting bonding wiring to the light emitting element 213 is mounted on the sub mount 216 to connect the light emitting element 213 to the electrode pin 211F along a circuitous route formed by the bonding wires 214A and 214J.

Further, the optical transmission module 201 includes a metal cap 217 having an opening 217a in a ceiling portion thereof and sealing the parts on the metal stem 210, a transparent window 218 for sealing the opening 217a, a refractive index matching agent 224 provided between the transparent widow 218 and the optical waveguide 215 and a coupler member 230 mounted on the cap 217 connected to an optical fiber 202.

The metal stem 210 takes in the form of a circular disc formed of copper or a copper alloy so that the boding can be done to a surface thereof.

Of the electrode pins 211A to 211F, the electrode pins 211A to 211D are used for receiving signals, in which the electrode pins 211A and 211B are for differential signals and the electrode pin 211C is for grounding. The electrode pins 211D is used for an power source. The electrode pins 211E to 211F are used for transmission, in which the electrode pin 211E is used for grounding. The electrode pin 211F is used for an electrode of input signals.

The light receiving element 212 is a surface type optical element mounted on an upper surface of the metal stem 210. On an upper surface of the light receiving element 212, the light receiving portion 212a and two electrodes are mounted. The light receiving element 212 may be, for example, a GaAs PIN photo diode.

The light emitting element 213 is a surface type optical element mounted on the upper surface of the metal stem 210. On an upper surface of the light emitting element 213, the light emitting portion 213a and one electrode are mounted and, on a lower surface thereof, an electrode is provided. The light emitting element 213 may be, for example, a VCSEL of 850 nm. Incidentally, it may be possible to use a light emitting element having two electrodes on the upper surface thereof.

The optical waveguide 215 is, for example, a high molecular optical waveguide and is configured by a core member of such as acrylic resin, epoxy resin or polyimide resin, in which a distribution light transmission portion 215*a* having an inverted Y shape is formed, and a clad formed of such as fluorocarbon polymer having refractive index smaller than that of the core member and surrounding the light transmission portion 215*a*. Such optical waveguide 215 may be fabricated as follows. That is, the high molecular optical waveguide is fabricated by filling a recessed portion formed in a surface of a hardened resin mold with core forming resin such as thermosetting or ultraviolet-ray setting resin, attaching a clad forming film member to a surface of the mold, setting the core forming resin, removing the hardened core forming resin from the mold and forming a clad layer on the core forming surface side of the clad forming film. Incidentally, the pattern of the optical guide portion 215*a* is not limited to the inverted Y shape and other patterns such as Y shape may be used correspondingly to a combination of the optical elements.

In order to reduce external noise, the cap 217 takes in the form of a canister formed of a metal such as copper, a copper alloy, aluminum or an aluminum alloy and has a lower end portion fixed to the metal stem 210 by, for example, electrically conductive adhesive as shown in FIG. 11.

The transparent window 218 is formed of a plastic material such as polymethyl methacrylate, polycarbonate or amorphous polyolefin or inorganic glass.

The IC 219 includes an amplifier circuit for amplifying an output signal of the light receiving element 212 and a plurality of electrodes formed on the upper surface thereof and is arranged adjacent to the light receiving element 212.

The refractive index matching agent 224 is formed of a transparent material having refractive index similar to refractive index of the optical waveguide 215 and the transparent window 218 and may be formed of, for example, silicon resin or ultraviolet-ray setting adhesive.

The coupler member 230 is formed by, for example, a transparent resin molding and detachably mounted on the cap 217. The coupler member 230 includes a housing portion 231, in which the cap 217 is housed, a lens portion 232 formed in a center portion of the housing portion 231, a cylindrical optical fiber insertion portion 233 formed on an upper portion of the housing portion 231, into which the optical fiber 202 is inserted, and a collar portion 234 provided an outer periphery of the optical fiber insertion portion 233.

(Construction of the Sub Mount)

Figure 12:
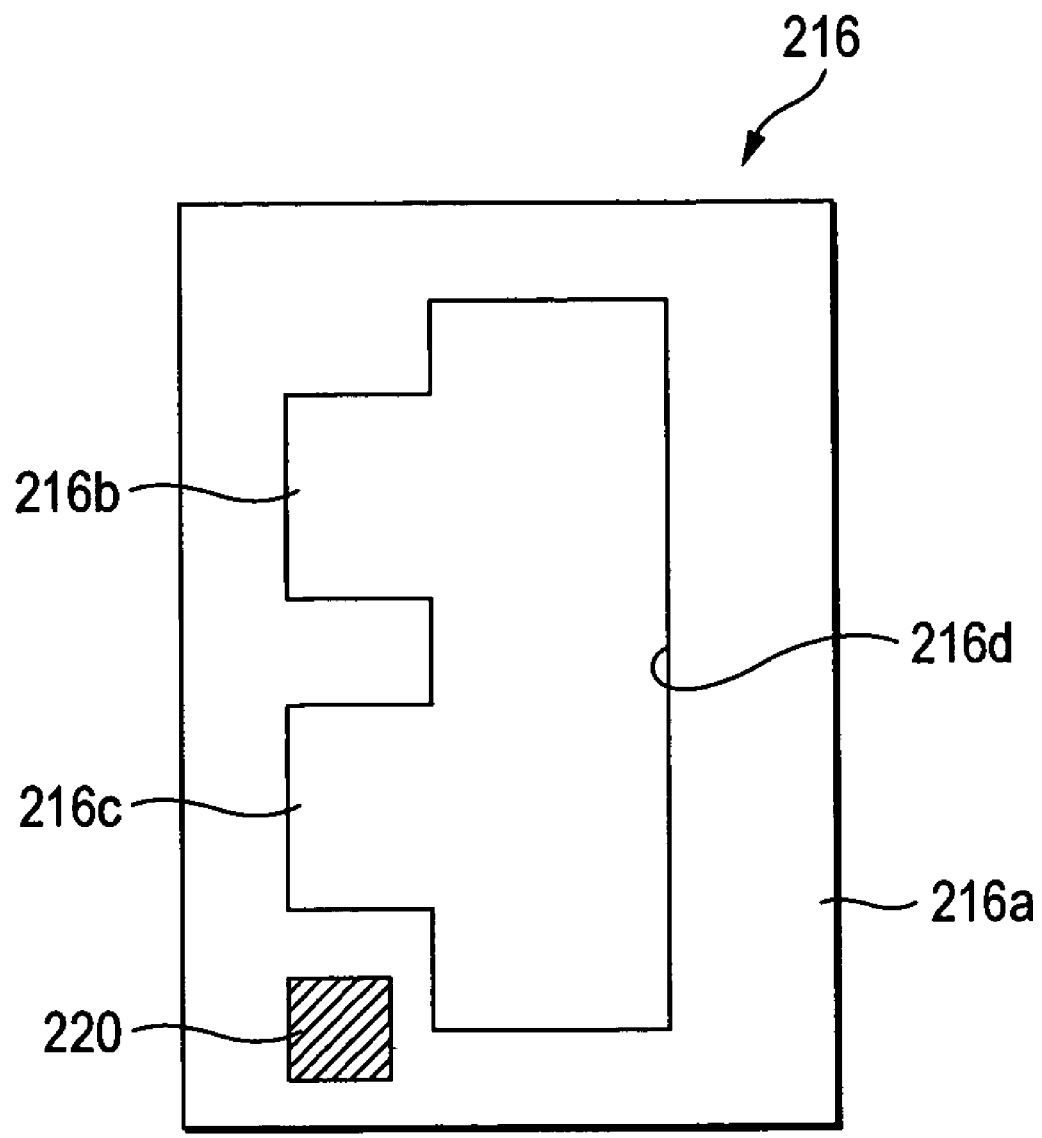
FIG. 12 is a plan view showing a construction of a sub mount.

FIG. 12 shows a construction of the sub mount. The sub mount 216 includes a body portion 216*a* formed of an insulating material such as silicon and a through-hole 216*d* provided in a center portion of the body 216*a*. An outer configuration of the sub mount 216 is matched to the light receiving element 212 and the light emitting element 213 with the optical waveguide 215 mounted thereon. The through-hole 216*d* includes a light receiving element mounting portion 216*b* for positioning the light receiving element 212 and a light emitting element mounting portion 216*c* for positioning the light emitting element 213. Further, the relay electrode portion 220 is formed on the upper surface of the sub mount 216 in the vicinity of the light emitting element mounting portion 216*c*.

The relay electrode portion 220 is a pad formed from a thin Au film. A configuration of the pad may be circular or rectangular. The relay electrode portion 220 is formed in a position remote from the optical waveguide 215, that is, in a position on the circuitous route extending from the electrode of the light emitting element 213 to the electrode pin 211F connected to the electrode of the light emitting element 213 and skirting around the optical waveguide 215. In the fifth embodiment, the relay electrode portion 220 is formed in a corner of the upper surface of the rectangular sub mount 216.

(Assembling of the Optical Transmission Module)

First, the IC 219 and the sub mount 216 are arranged in predetermined positions on the metal stem 210. The sub mount 216 is fixed to the predetermined position by an adhesive. Then, the light receiving element 212 and the light emitting element 213 are positioned and fixed in the light receiving element mounting portion 216*b* and the light emitting element mounting portion 216*c* of the sub mount 216, respectively. In this case, the electrode in the lower surface of the light emitting element 212 is grounded by the contact with the upper surface of the metal stem 210.

Next, the IC 219 is connected to the light receiving element 212 and predetermined position on the metal stem 210 by bonding wires 214H, 214I, 214F and 214G and is further connected to the electrode pins 211A, 211B and 211D by bonding wires 214E, 214D and 214B, respectively. The electrode of the light emitting element 213 is connected to the relay electrode 220 by a bonding wire 214J and the relay electrode 220 is connected to the electrode pin 211F by a bonding wire 214A. The electrode pin 211C is connected to the upper surface of the metal stem 210 by a bonding wire 214C.

Next, the optical waveguide 215 is positioned and fixed in the through-hole 216*d* of the sub mount 216. Further, the refractive index matching agent 224 is put on the optical waveguide 215 and, in this state, the cap 217 having the transparent window 218 is fixed onto the metal stem 210.

The optical transmission module 201 thus fabricated is mounted by inserting the electrode pins 211A to 211F thereof into connecting holes (through-holes) formed in a circuit board. Next, the coupler member 230 having the lens portion 232 and the optical fiber insertion portion 233 is fitted on the cap 217. After the optical fiber 202 is inserted into the optical fiber insertion portion 233 and the coupler member 230 is positioned, the coupler member 230 is fixed on the cap 217 by such as epoxy resin. Thus, the optical transmission device is fabricated.

(Operation of the Optical Transmission Device)

When an optical signal is transmitted through the optical fiber 202, the signal is guided to the light guide portion 215*a* of the optical waveguide 215 through the lens portion 232 of the coupler member 230, the transparent window 218 and the refractive index matching agent 224. The optical signal from the light guide portion 215*a* is guided to the light receiving portion 212*a* of the light receiving element 212 and converted into an electric signal by the light receiving element 212. The electric signal is amplified by the IC 219 and outputted to the circuit board through the electrode pins 211A and 211B.

On the other hand, when a drive signal is inputted from the circuit board to the electrode pin 211F, the light emitting element 213 is driven and an optical signal is outputted from the light emitting portion 213a. This optical signal is supplied to the optical guide portion 215a of the optical waveguide 215 and then to the refractive index matching agent 224. Further, the optical signal is sent to the optical fiber 202 through the transparent window 218 and the lens portion 232. Thus, the interactive communication is performed through the optical waveguide.

According to the fifth embodiment, the following advantages can be obtained.

(a) By providing the relay electrode portion 220 on the sub mount 216 and providing the circuitous electrical connection going around the light emitting element 213 and the electrode pin 211F through the relay electrode portion 220 and the bonding wires 214A and 214J, it is possible to perform the wire bonding without blocking by the optical waveguide 215 even when the optical waveguide 215 is mounted vertically. Further, bonding wires are not broken by vibration of the optical waveguide 215 even if the wires contact with the optical waveguide 215.

(b) Since the optical waveguide 215 can be mounted after the wire bonding is performed, it is possible to prevent the light guide portion 215a of the optical waveguide 215 from being damaged by heat generated during the wire bonding.

(c) Since it is possible to make the bonding wire shorter by the use of the relay electrode 220, it is possible to prevent the wire and the wire connecting portion from being broken due to such as vibration to thereby improve the high frequency characteristics.

(d) By the provision of the relay electrode portion 220 for connection between the light emitting element 213 and the electrode pin 211F, there is no restriction of configuration of the optical transmission module 201 and the design freedom is improved. In particular, the restriction hardly occurs by providing the relay electrode portion 220 on the sub mount 216.

(e) Since, in order to realize a relay connection between the light emitting element 213 and the electrode pin 211, it is enough to provide the relay electrode portion 220, the increase of the number of parts can be prevented, so that the fabrication of the optical transmission module 201 becomes easier and the reduction of fabrication cost becomes possible.

(f) A high density mounting becomes possible by mounting the light receiving element 212, the light emitting element 213 and the optical waveguide 215 as other mounting parts on the sub mount 216 together with other electronic parts.

(g) Since the sub mount 216 is formed of silicon material, a complicated structure of the sub mount can be formed.

Incidentally, though, in the fifth embodiment, the optical waveguide 215 is mounted on the sub mount after the wire bonding between the light emitting element 213 and the relay electrode 220 and between the relay electrode 220 and the electrode pin 211F are completed, the order of the wire bonding and the mounting of the optical waveguide is not limited to the described order. For example, it is possible that the optical waveguide 215 is mounted after the wire bonding of the electrode of the light emitting element 213 and the relay electrode 220, and then the relay electrode 220 is wire bonded to the electrode pin 211F. Since the relay electrode 220 is remote from the optical wave guide 215, it is possible to restrict thermal influence on the optical waveguide 215 during the wire bonding.

Sixth Embodiment

Figure 13:
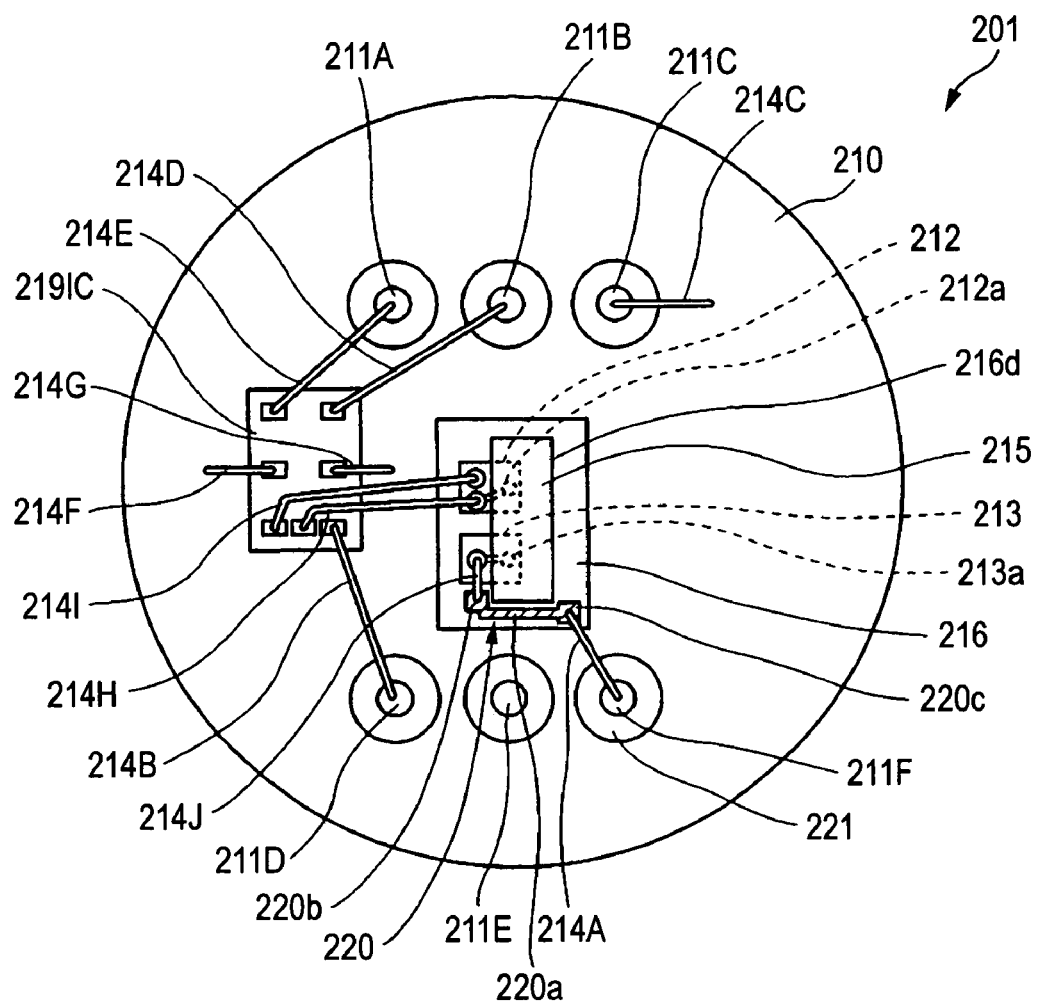
FIG. 13 is a plan view of an optical transmission module according to a sixth embodiment.

FIG. 13 shows another construction of the optical transmission module according to the sixth embodiment of the present invention. The sixth embodiment is similar to the fifth embodiment except that the relay electrode 220 of the fifth embodiment is modified by using a wiring pattern having predetermined length.

The relay electrode 220 in the sixth embodiment is formed from a copper foil and is provided in parallel to a line of the electrode pins 211D to 211F so that it skirts the optical waveguide 215. The relay electrode 220 includes a lead pattern 220a slightly longer than a thickness of the optical waveguide 215 and electrodes 220b and 220c formed in opposite ends of the lead pattern 220a, respectively.

The electrode 220b is provided adjacent to the light emitting element 213 and is connected to the electrode of the light emitting element 213 by a bonding wire 214J. The electrode 220c is provided in a position close to the electrode pin 211F and connected to the electrode pin 211F by a bonding wire 214A.

According to the sixth embodiment, the following effects are obtained.

(a) By the relay electrode 220 having the wiring pattern and mounted on the sub mount 216, the circuitous wiring, which goes around the optical waveguide 215, it is possible to improve the assembling ability and the high frequency characteristics of the optical transmission module. Further, as in the fifth embodiment, it is possible to prevent the interference with the optical waveguide 215 in bonding and restrict thermal influence on the optical waveguide 215 in bonding.

(b) By the provision of the electrode 220c of the relay electrode 220 in the vicinity of the electrode pin 211F, it is possible to make the bonding wire 214A shortest to thereby avoid deformation of the bonding wire 214A and contact with other members such as the metal stem 210 and the electrode pin 211E, compared with the fifth embodiment.

(c) By providing the wiring pattern to the relay electrode 220, the length of the bonding wire can be reduced compared with the fifth embodiment, so that the reliability of the module is improved.

(d) By providing the wiring pattern to the relay electrode 220, more complicated wiring becomes possible, so that the reliability of the module can be improved compare with the case where the length of bonding wire is increased.

Seventh Embodiment

Figure 14:
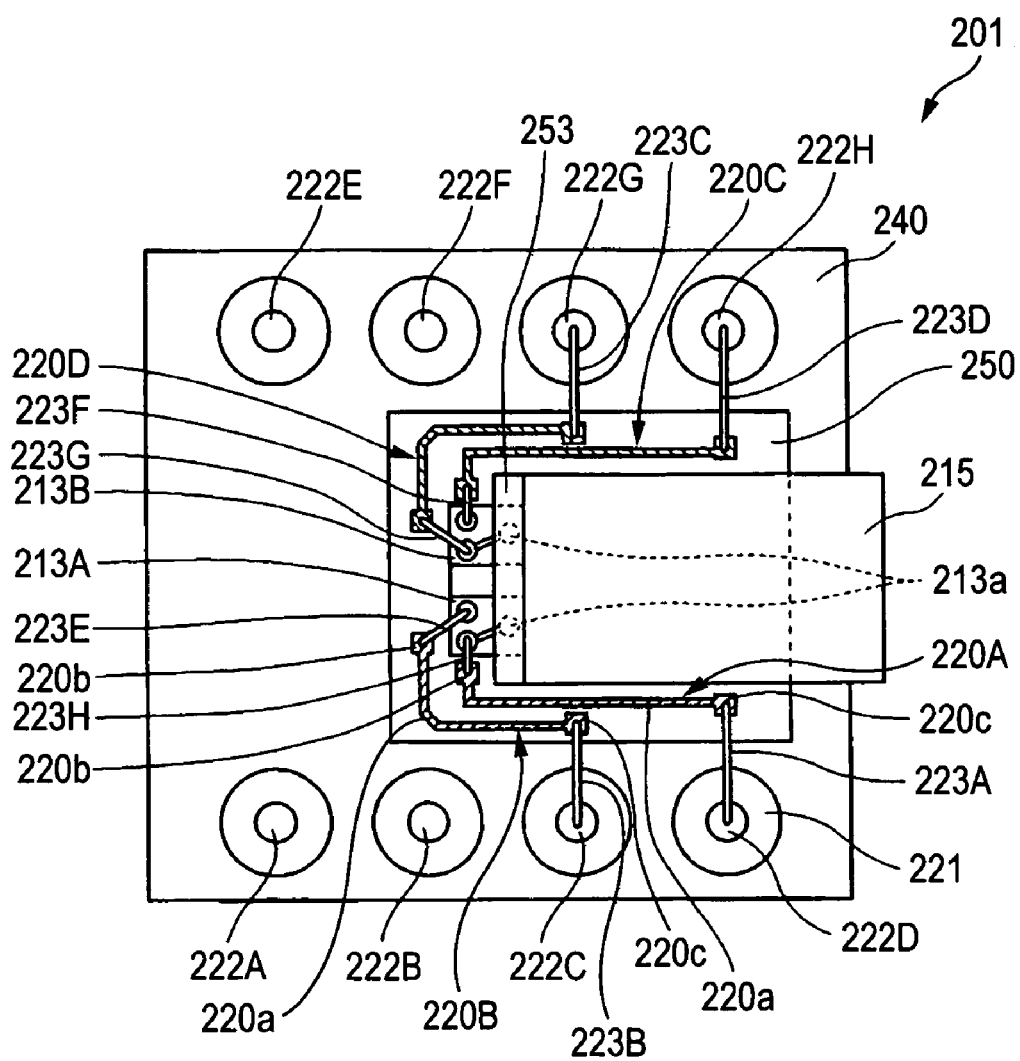
FIG. 14 is a plan view of an optical transmission module according to a seventh embodiment.
Figure 15:
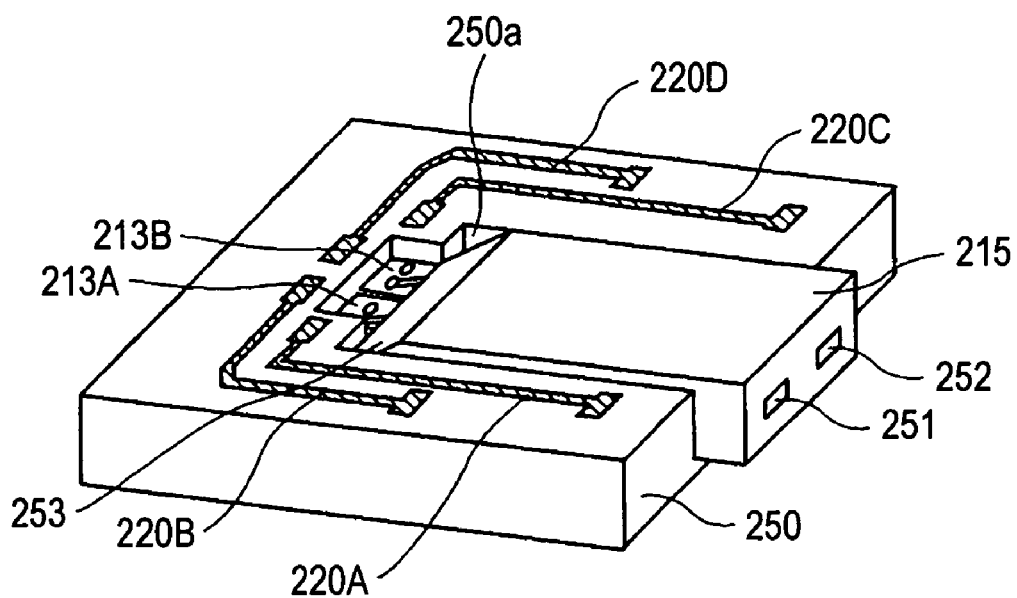
FIG. 15 is a perspective view showing a construction of an optical transmission module shown in FIG. 5 on the sub mount.

FIG. 14 shows the optical transmission module according to a seventh embodiment and FIG. 15 shows a construction of the optical transmission module shown in FIG. 14 on a sub mount.

The seventh embodiment is similar to the sixth embodiment except that, in the seventh embodiment, the optical waveguide 215 is arranged in parallel to the metal stem 240, a metal stem 240 and a sub mount 250 having shapes matched to the shape of the horizontally arranged optical waveguide 215 are used and a second light emitting element is provided instead of the light receiving element 212 in the sixth embodiment.

As shown in FIGS. 14 and 15, the optical waveguide 215 includes optical guide portions 251 and 252 optically coupled to the light emitting portions 213a of the first and second light emitting elements 213A and 213B and a 45° mirror 253 for inputting lights from the light emitting portions 213a of the first and second light emitting elements 213A and 213B to the optical guide portions 251 and 252. The optical waveguide 215 is mounted on the sub mount 250 in parallel thereto.

Each of the optical guide portions 251 and 252 includes a core similar to the core of the optical lead portion 215a in the fifth embodiment and a clad formed of a material having refractive index smaller than that of the core.

The 45° mirror 253 is formed by cutting an edge of one end of the optical waveguide 215 at 45° and a reflection film is formed on the cut surface by vapor deposition of silver.

The metal stem 240 has a rectangular form and formed of a material similar to the material of the metal stem 210. Electrodes pins 222A to 222D and 222E to 222H are arranged in two lines in the vicinity of opposing two sides of the metal stem 240 and the optical waveguide 215 is arranged between the lines of the pins. Further, in order to protect the first and second light emitting elements 213A and 213B and other mounting parts, a cap, which is not shown, is mounted on the metal stem 240 on demand after the wiring is completed.

The sub mount 250 is formed of a similar material to that of the sub mount 216. As shown in FIG. 15, the sub mount 250 includes a recessed portion 250a for positioning the first and second light emitting elements 213A and 213B and the optical waveguide 215 and has a lateral width enough to protrude the optical waveguide 215 from the end face of the sub mount 250.

Further, relay electrode portions 220A to 220D having the optical lead patterns 220a(electrical wirings) and the electrodes 220b and 220c are formed on the sub mount 250 along the two sides of the optical waveguide 215. The relay electrode portion 220A is used to connect between a terminal of the first light emitting element 213A and the electrode pin 222D. The relay electrode portion 220B is used to connect between the terminal of the first light emitting element 213A and the electrode pin 222C, the relay electrode portion 220C is used to connect between a terminal of the second light emitting element 213B and the electrode pin 222H and the relay electrode portion 220D is used to connect between the terminal of the second light emitting element 213B and the electrode pin 222G.

Figure 16:
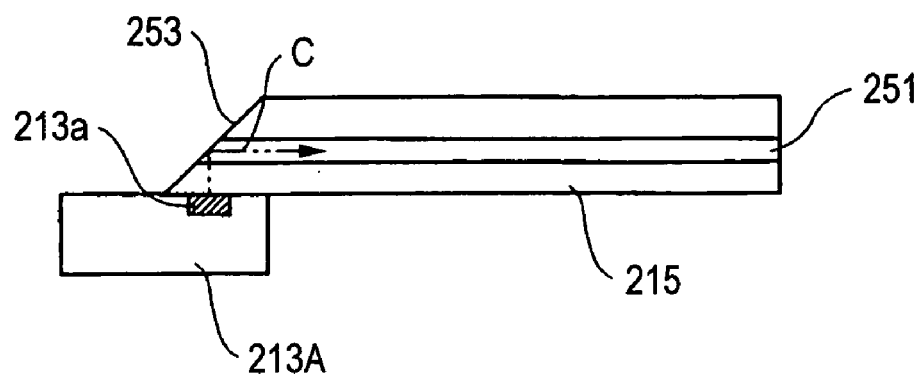
FIG. 16 is a cross section showing an arrangement of the optical waveguide and the light emitting element.

FIG. 16 shows an arrangement of the optical waveguide and the light emitting element of the seventh embodiment. Though the arrangement of the first light emitting element 213A and the optical waveguide 215 is shown in FIG. 16, the second light emitting element 213B is similarly arranged. The 45° mirror 253 of the optical waveguide 215 is positioned above the light emitting portion 213a of the first light emitting element 213A and an output light from the light emitting portion 213a is reflected by the 45° mirror 253 as shown by an arrow C to the light guide portion 251.

(Assembling of the Optical Transmission Module)

First, the sub mount 250 is fixed in a predetermined position on the metal stem 240 and the first and second light emitting elements 213A and 213B are positioned in predetermined positions on the sub mount 250. Next, the electrodes 220c of the relay electrode portions 220A to 220D are connected to the electrode pins 222D, 222C, 222H and 222G by bonding wires 223A, 223B, 223D, and 223C in this order. Further, the first light emitting element 213A is connected to the electrodes 220b of the relay electrode portions 220A and 220B by bonding wires 223H and 223E and the second light emitting element 213B is connected to the relay electrode portions 220C and 220D by bonding wires 223F to 223G.

Next, the optical waveguide 215 is mounted on the sub mount 250 such that the 45° mirror 253 is overlapped on the light emitting portion 213a. Thus, the optical transmission module 201 is completed. Incidentally, the optical fiber is connected to the end faces of the optical guide portions 251 and 252 through a coupler, which is not shown.

According to the seventh embodiment, the relay electrode portions 220A to 220 D are provided on the sub mount 250 and the light emitting elements 213A and 213B are electrically connected to the electrode pins 222C, 222D, 222G and 222H by the bonding wires 223A to 223D, and 223E to 223H through the circuitous routes going around the optical waveguide. Therefore, the wire bonding can be done without hindrance of the optical waveguide 215 when the optical waveguide 215 is mounted horizontally and the optical waveguide 215 can be mounted after the bonding.

Other Embodiments

Incidentally, the present invention is not limited to the described embodiments and these may be modified in various manners within the scope of the technical thought of the present invention. For example, though the light receiving element and a light emitting element are used in the first and second embodiments and the two light emitting elements instead of the light emitting element and the light emitting element are used in the seventh embodiment, it is possible to use two light receiving elements, a single light emitting or light receiving element may be used. The number of optical elements and the combination thereof are arbitrary.

Further, though the amplifying IC is arranged in the module in the fifth and sixth embodiments, the amplifying IC may be arranged on the circuit board side. Further, a light receiving element, a light emitting element and a drive IC for driving the light emitting element may be arranged in the module or a light emitting element, a light receiving element, an amplifying IC and a drive IC can be arranged in the module.

According to the above-embodiments, it becomes possible to wire in a circuitous route going around the mounted parts by the relay electrode assisting the wiring to thereby facilitate the electric connection within the module. Further, even when the bonding wires are connected to the relay electrode after the mounting parts are mounted, it is possible to restrict the thermal influence on the mounting parts in bonding them since the relay electrode is remote from the mounting parts.

According to the above-embodiments, even when the mounting part is higher than the optical element, the wiring is possible through the relay electrode without interference with the mounting parts.

According to the above-embodiments, the relay electrode may be formed in a position on a circuitous route connecting the electrode of the optical element to a terminal therefor and going around the mounting parts or in a corner portion of an upper surface of the sub mount having a rectangular shape. With such construction, it is possible to restrict thermal influence on the mounting parts in bonding them and to wire through the relay electrode without interference with the mounted parts.

According to the above-embodiments, the mounting part is an optical waveguide mounted on the sub mount. By mounting the optical waveguide and the optical element on the sub mount, the optical axis alignment of the optical element and the optical waveguide becomes easy and the miniaturization of the module becomes facilitated.

According to the above-embodiments, when the optical waveguide is a high molecular optical waveguide, which tends to be influenced by heat, the thermal influence on the high molecular optical waveguide is removed by providing the relay electrode for assisting the wiring in a position remote from the optical waveguide and providing a wiring around the optical waveguide along the circuitous route through the relay electrode.

According to the above-embodiments, the optical element may be a surface type optical element having a light receiving portion or a light emitting portion and the optical waveguide may stand on the light receiving portion or the light emitting portion of the optical element. By using the surface type optical element as the optical element, the structure, in which the optical waveguide stands on the surface emitting element, is easily employed.

According to the above-embodiments, by connecting a plurality of bonding wires to the relay electrode, the circuitous wiring with respect to the mounting part becomes easy.

According to the above-embodiments, the relay electrode may have a wiring pattern of a predetermined length. In such case, it is possible to shorten the bonding wires connected to the relay electrode to thereby prevent the wire connecting portion or the wire from being broken due to, for example, vibration.

According to the above-embodiments, when the mounting part is an electronic part mounted on the sub mount, a high density mounting becomes possible by arranging the electronic part in the vicinity of the optical element. Further, the circuitous wiring using the electrode for assisting the wiring may be applied to a case where the mounting part is an electronic part mounted on the mounting surface on which the sub mount is to be mounted and interference with the electronic part associated with the wire bonding can be avoided. Such electronic part may be, for example, an amplifier IC for the light receiving element, capacitors or a drive IC for driving the light emitting element.

According to the above-embodiments, the sub mount includes a base member formed of silicon and, by forming the electrode on a surface of the base member, the formation of the sub mount, which has a complicated structure, becomes possible and the formation of the electrode becomes easy.

According to the above-embodiments, it is possible to provide a low cost optical transmission module, which houses mounting parts such as an optical element and an optical waveguide and in which electrical connection within the module can be done easily and the design freedom is high.

According to the above-embodiments, it is possible to provide an optical transmission module housing mounting parts such as an optical element and an optical waveguide, which can restrict thermal influence of bonding and has high reliability in high speed operation.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined solely by the following claims and their equivalents.

What is claimed is:

1. An optical module comprising:
   a base portion;
   a surface type optical element receiving or emitting light;
   an optical waveguide being mounted on the base portion, the optical waveguide having on a first end portion of the optical waveguide light input/output end face that transmits light therebetween;
   a holding member being mounted on the base portion, the holding member positioning and holding the surface type optical element and the first end portion of the optical waveguide;
   a cap being mounted on the base portion, the cap having a light transmitting window provided in a position opposing to a second end portion of the optical waveguide, the cap at least partially covering the optical element and the optical waveguide; and
   a fixing member that fixes the second end portion of the optical waveguide to the light transmitting window of the cap wherein the fixing member has a first through-hole for positioning the surface type optical element by inserting the surface type optical element into the first through-hole and a second through-hole for positioning the optical waveguide by inserting the optical waveguide into the second through-hole.

2. An optical module according to claim 1, wherein the optical waveguide is a plate-like waveguide.

3. An optical module according to claim 1, wherein the fixing member is an adhesive having refractive index matching, for adhering the second end portion of the optical waveguide to the light transmitting window of the cap.

4. An optical module according to claim 1, wherein the fixing member is a filler having refractive index matching characteristics, for filling a peripheral portion of the second end portion of the optical waveguide.

5. An optical module according to claim 1, wherein the fixing member is an elastic member for fixing the optical waveguide under pressure,
   wherein the elastic member is provided between the second end portion of the optical waveguide and the light transmitting window of the cap, and
   wherein the elastic member has refractive index matching characteristics.

6. An optical module according to claim 1, wherein the fixing member has adhesiveness, elasticity and refractive index matching characteristics, for fixing the second end portion of the optical waveguide and the light transmitting window of the cap.

7. An optical module according to claim 1, wherein the fixing member is an elastic member for fixing the optical waveguide under pressure, and
   wherein the elastic member is provided between a portion of the optical waveguide other than a light input/output portion of the second end portion of the optical waveguide and the cap.

8. An optical module according to claim 1, wherein the fixing member is an adhesive for adhering a portion of the optical waveguide other than a light input/output portion of the second end portion of the optical waveguide to the cap.

9. An optical module according to claim 1, wherein the light transmitting window of the cap has a recessed portion on a side of the optical waveguide,
   wherein the fixing member having refractive index matching is fitted in the recessed portion, and
   wherein the fixing member fixes the second end portion of the optical waveguide in the recessed portion.

10. An optical module according to claim 1, wherein the base portion and the cap are formed of metal.

11. An optical module according to claim 1, wherein the surface type optical element comprises a surface type light emitting element and a surface type light receiving element, wherein the optical waveguide comprises an optical guide portion for connecting a light input/output portion of the light input/output first end face to a light input/output end portion of one of the light input/output end face of the second end portion, wherein a light input/output portion of the light input/output first end face is optically connected to the surface type light emitting element and the surface type light receiving element, respectively, wherein the light input/output end portion of one of the light input/output end face of the second end portion is optically connected to an external optical transmission medium.

12. An optical transmission device comprising:

an optical module according to claim 1;

a coupler member having an optical system connected to the optical transmission medium mounted on the optical module and a circuit board connected to the optical module.

13. An optical module comprising:

a base portion;

a surface type optical element receiving or emitting light;

an optical waveguide being mounted on the base portion, the optical waveguide having on a first end portion of the optical waveguide light input/output end face that transmits light therebetween;

a holding member being mounted on the base portion, the holding member positioning and holding the surface type optical element and the first end portion of the optical waveguide;

a cap being mounted on the base portion, the cap having a light transmitting window provided in a position opposing to a second end portion of the optical waveguide, the cap at least partially covering the optical element and the optical waveguide; and a fixing member that fixes the second end portion of the optical waveguide to the light transmitting window of the cap;

wherein the fixing member has a first recessed portion for positioning the surface type optical element by fitting the surface type optical element in the first recessed portion and a second recessed portion for positioning the optical waveguide by fitting the optical waveguide in the second recessed portion.

* * * * *